United States Patent
Tu et al.

(10) Patent No.: US 7,382,012 B2
(45) Date of Patent: Jun. 3, 2008

(54) REDUCING PARASITIC CAPACITANCE OF MIM CAPACITOR IN INTEGRATED CIRCUITS BY REDUCING EFFECTIVE DIELECTRIC CONSTANT OF DIELECTRIC LAYER

(75) Inventors: Kuo-Chi Tu, Hsin-Chu (TW); Chun-Yao Chen, Hsin-Chu (TW); Yi-Ching Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 43 days.

(21) Appl. No.: 11/361,330

(22) Filed: Feb. 24, 2006

(65) Prior Publication Data

US 2007/0200162 A1 Aug. 30, 2007

(51) Int. Cl.
*H01L 27/108* (2006.01)
*H01L 21/20* (2006.01)
*G11C 11/00* (2006.01)

(52) U.S. Cl. .............. 257/303; 438/387; 438/396; 365/60

(58) Field of Classification Search ......... 257/296–298
See application file for complete search history.

(56) References Cited

U.S. PATENT DOCUMENTS

| | | | |
|---|---|---|---|
| 6,258,691 B1 * | 7/2001 | Kim | ........................... 438/398 |
| 6,472,266 B1 | 10/2002 | Yu et al. | |
| 6,492,245 B1 | 12/2002 | Liu et al. | |
| 6,496,402 B1 | 12/2002 | Somasekhar et al. | |
| 6,500,706 B1 | 12/2002 | Chi | |
| 6,501,120 B1 | 12/2002 | Tu et al. | |
| 6,567,288 B2 | 5/2003 | Keeth | |
| 6,570,781 B1 | 5/2003 | Lee et al. | |
| 6,713,840 B1 | 3/2004 | Lee et al. | |
| 6,949,785 B2 * | 9/2005 | Tu | ............................. 257/301 |
| 2002/0158337 A1 * | 10/2002 | Babich et al. | ............... 257/758 |
| 2004/0036051 A1 * | 2/2004 | Sneh | ........................... 251/301 |
| 2004/0084709 A1 * | 5/2004 | Kim et al. | ................... 257/306 |
| 2004/0201053 A1 * | 10/2004 | Tu et al. | ...................... 257/296 |
| 2004/0266130 A1 * | 12/2004 | Wang | ........................ 438/424 |
| 2005/0029609 A1 * | 2/2005 | Bhattacharyya et al. | .... 257/428 |
| 2005/0037604 A1 * | 2/2005 | Babich et al. | .............. 438/619 |
| 2005/0151183 A1 * | 7/2005 | Tu | ............................. 257/301 |

OTHER PUBLICATIONS

Chang, L.-F., et al., "A New DRAM Cell Structure with Capacitor-Equiplanar-to-Bitline (CEB) for Bitline Coupling Noise Elimination," IEEE, 1998, pp. 428-431.

* cited by examiner

*Primary Examiner*—David Vu
*Assistant Examiner*—Andres Lopez Esquerra
(74) *Attorney, Agent, or Firm*—Slater & Matsil, L.L.P.

(57) ABSTRACT

A memory device having improved sensing speed and reliability and a method of forming the same are provided. The memory device includes a first dielectric layer having a low k value over a semiconductor substrate, a second dielectric layer having a second k value over the first dielectric layer, and a capacitor formed in the second dielectric layer wherein the capacitor comprises a cup region at least partially filled by the third dielectric layer. The memory device further includes a third dielectric layer over the second dielectric layer and a bitline over the third dielectric layer. The bitline is electrically coupled to the capacitor. A void having great dimensions is preferably formed in the cup region of the capacitor.

17 Claims, 14 Drawing Sheets

REDUCING PARASITIC CAPACITANCE OF MIM CAPACITOR IN INTEGRATED CIRCUITS BY REDUCING EFFECTIVE DIELECTRIC CONSTANT OF DIELECTRIC LAYER

TECHNICAL FIELD

This invention relates generally to a capacitor, and more particularly to a capacitor in a dynamic random access memory, and even more particularly to a structure and fabrication methods for a Metal-Insulator-Metal (MIM) capacitor structure.

BACKGROUND

Developments in the semiconductor industry have over the years been aimed at creating higher performance devices at competitive or lower prices. These developments have resulted in extreme miniaturization of semiconductor devices, which has been made possible by numerous and mutually supporting advances in semiconductor processes and by advances in the materials that are used for the creation of semiconductor devices. While most semiconductor devices are aimed at processing digital data, dynamic random access memory (DRAM) storage devices incorporate data retention or storage capabilities. The creation of capacitive components, which are the basis for the data storage capabilities of DRAM devices, must emphasize that these capacitive components are created on a relatively small surface area of a semiconductor substrate while using methods and procedures that are well known in the art of creating semiconductor devices.

It is well known that capacitors can be created between layers of metal or polysilicon. Capacitors can be either of a planar design, for reasons of process simplicity, or can be three-dimensional, resulting in a smaller footprint as commonly used in DRAM devices.

DRAM devices typically consist of arrays of memory cells that perform two basic functions, namely data access controlling performed by a transistor and data retaining performed by a capacitor. Binary data is stored as electrical charges in the capacitors in DRAM memory cells. Contacts to the surrounding circuits are provided for the DRAM memory cells. DRAM memory is so named because DRAM cells can retain information only for a limited period of time before they must be read and refreshed at periodic intervals. In a typical DRAM construction, one side of the transistor is connected to one side of the capacitor. The other side of the transistor and the transistor gate electrode are connected to external connect points that form bit and word lines. The other side of the capacitor is connected to a reference voltage.

DRAM cells can be formed using a capacitor-over-bitline (COB) scheme or a capacitor-under-bitline (CUB) scheme. In a COB scheme, capacitors are formed over the bitline to which the capacitors are coupled, while in a CUB scheme, capacitors are formed under the bitline to which the capacitors are coupled. Typically, memory cells formed using CUB scheme are preferred by embedded DRAM applications although they have higher bitline coupling noise than memory cells formed using a COB scheme.

High performance is demanded for embedded DRAM cells, particularly embedded DRAM cells for system on chip (SOC) applications. Among the performance requirements, bitline sensing speed and sensing margin are important performance criteria that affect the speed and reliability of DRAM cells.

Bitline sensing speed and signal sensing margin are both affected by bitline parasitic capacitance. The sense signal $\Delta V$, which is a signal detected by a sense amplifier to distinguish a state of the memory cell, can be generally expressed as:

$$\Delta V = \frac{1}{2} V_{cc}/(1+C_{bl}/C_s) \qquad [\text{Eq. 1}]$$

wherein Vcc is the operation voltage of the memory device, $C_{bl}$ is bitline parasitic capacitance, and $C_s$ the capacitance of the capacitor storing charges.

If bitline parasitic capacitance $C_{bl}$ is reduced, the sense signal $\Delta V$ detected by the sense amplifier increases, thus reducing the probability of a read error. Additionally, if the bitline parasitic capacitance $C_{bl}$ reduces, fewer charges will be required to charge and discharge parasitic capacitors, resulting in an increased memory access speed.

Therefore, in order to form dynamic random access memory having high speed and high reliability, bitline parasitic capacitance needs to be reduced.

SUMMARY OF THE INVENTION

The preferred embodiment of the present invention provides a memory device having improved sensing speed and reliability.

In accordance with one aspect of the present invention, the memory device includes a first dielectric layer having a first k value over a semiconductor substrate, a second dielectric layer having a second k value over the first dielectric layer, and a capacitor formed in the second dielectric layer. The memory device further includes a third dielectric layer over the second dielectric layer and a bitline over the third dielectric layer and electrically coupled to the capacitor. The capacitor comprises a cup region at least partially filled by the third dielectric layer. A void having great dimension is preferably formed in the cup region of the capacitor. The first, second and third dielectric layers preferably have low k values, preferably lower than about 3.8.

In accordance with another aspect of the present invention, a method for forming the preferred embodiments of the present invention includes providing a semiconductor substrate, forming a MOS device in the semiconductor substrate comprising a first and a second source/drain region, forming a first dielectric layer having a first dielectric constant (k value) over the semiconductor substrate, forming a second dielectric layer having a second k value over the first dielectric layer, and forming an opening in the second dielectric layer. The method further includes forming a capacitor in the opening. The formation of the capacitor includes forming a bottom electrode in the opening and connecting to the first source/drain region of the MOS device, forming a capacitor insulator on the bottom electrode, and forming a top electrode on the capacitor insulator.

In accordance with yet another aspect of the present invention, the method further includes forming a third dielectric layer over the second dielectric layer and the capacitor, wherein the capacitor comprises a cup region at least partially filled by the third dielectric layer. Preferably, the third k value is less than about 3.8, and more preferably less than about 2.3. A bitline is then formed over the third dielectric layer and is electrically connected to a second source/drain region of the MOS device.

The introduction of a low-k dielectric material, particularly the formation of voids, reduces bitline parasitic capacitance. The reliability and performance of the memory cell is improved accordingly.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
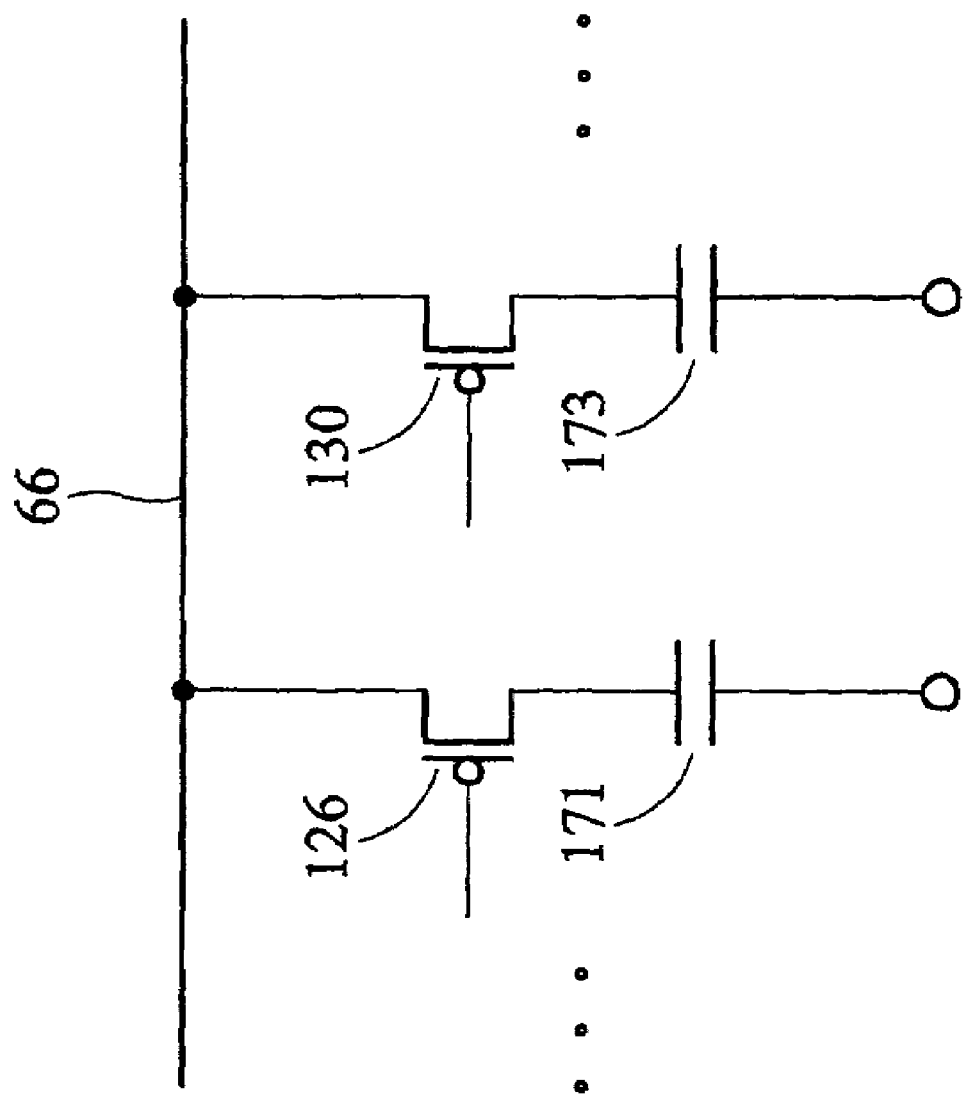
FIG. 1 illustrates a schematic circuit diagram of the preferred embodiment of the present invention.

FIG. 1 illustrates a schematic circuit diagram of a portion of a dynamic random access memory (DRAM) array. Two capacitors 171 and 173 are connected to a bitline 66 of the memory array. Access to capacitors 171 and 173 is controlled by gates 126 and 130 of the respective MOS transistors. Although transistors shown in FIG. 1 are PMOS transistors, NMOS transistors are also contemplated.

FIGS. 2 through 15 illustrate cross-sectional views of intermediate stages in the manufacture of a preferred embodiment of the present invention. Variations of the preferred embodiments are then discussed. Throughout the various views and illustrative embodiments of the present invention, like reference numbers are used to designate like elements.

Figure 2:
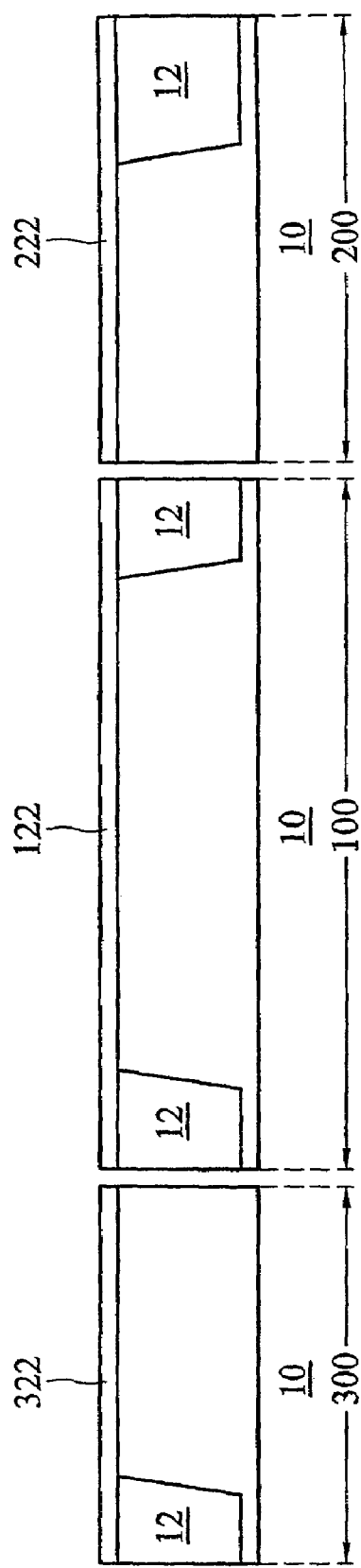
FIGS. 2 through 15 are cross-sectional views of intermediate stages in the manufacture of a memory cell embodiment, wherein the capacitor in the memory cell is of a cup-type.

FIG. 2 illustrates a substrate 10, which may be a bulk substrate or a silicon-on-insulator substrate. Substrate 10 includes a first device region 100, which is preferably a memory device region. In the preferred embodiment, memory device region 100 is an n-type well region for forming p-type transistors. In other embodiments, memory device region 100 is of p-type. A second device (well) region 200, which is a core device region, and/or a third device (well) region 300, for example, an I/O region, may also be included. Well regions 200 and 300 may be of p-type or n-type, depending on the type of devices to be formed. Isolation regions 12, preferably shallow trench isolation regions, are formed to isolate devices.

Gate dielectric layers 122, 222 and 322 are formed in device regions 100, 200 and 300, respectively. As is known in the art, gate dielectric layers 122, 222 and 322 are preferably formed of different materials and preferably have different thicknesses. For example, high performance is preferred for core devices, thus the gate dielectric layer 222 preferably has less thickness and a high dielectric constant. I/O devices, on the other hand, are typically required to sustain high I/O voltages. Therefore, dielectric layer 322 is preferably formed of oxides and preferably has greater thickness than that of core devices and memory devices. Gate dielectric layers 122, 222 and 322 may be formed by depositing a dielectric layer in one region while masking the other two regions.

Figure 3:
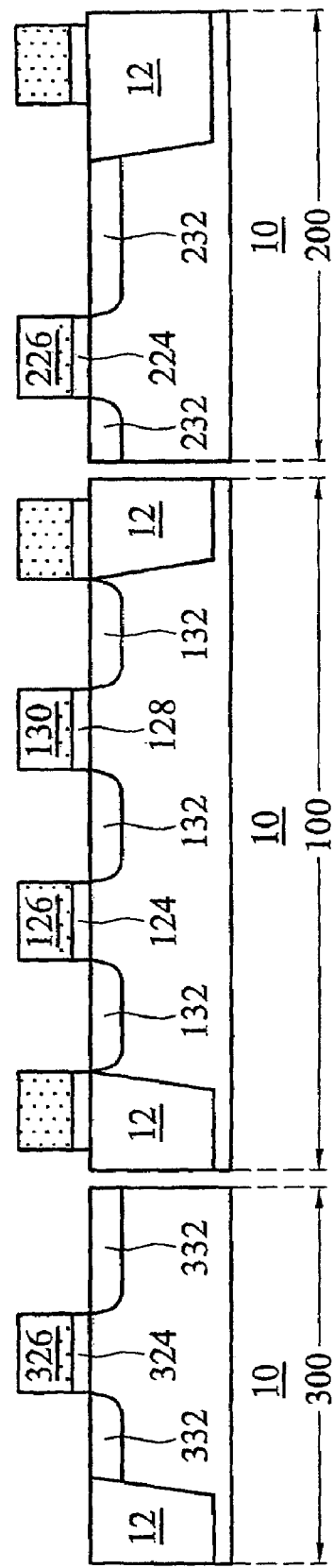

FIG. 3 illustrates the formation of gate structures and lightly doped source/drain regions. To form gate structures, gate electrode layers are formed on gate dielectric layers in device regions 100, 200, and 300. The gate electrode layers and gate dielectric layers are then patterned, forming gate dielectrics 124, 128 and gate electrodes 126 and 130 in device region 100, gate dielectric 224 and gate electrode 226 in region 200, and gate dielectric 324 and gate electrode 326 in region 300. Preferably, gate electrode 326 is formed of doped polysilicon, and gate electrode 226 is formed of metals, metal alloys or silicides, although the materials can be interchangeably used.

Lightly doped source/drain regions 132, 232, and 332 are then formed, preferably by implanting appropriate impurities.

Figure 4:
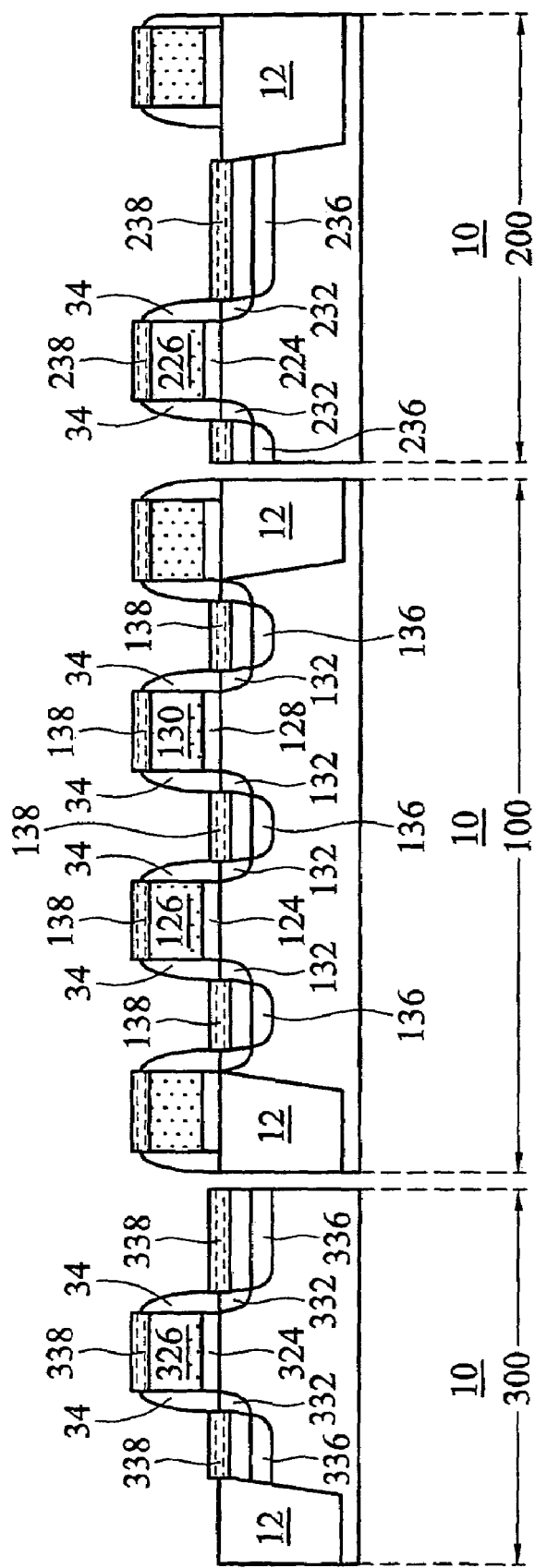

Referring to FIG. 4, spacers 34 and source/drain regions 136, 236 and 336 are formed. Spacers 34 are preferably formed by blanket depositing a dielectric layer and etching to remove lateral portions. Source/drain regions 136, 236 and 336 are then formed in device regions 100, 200 and 300, respectively, preferably by implanting. In the preferred embodiment, source/drain region 136 is of p-type. In alternative embodiments, source/drain regions 136 can be of n-type. The types of the source/drain regions 236 and 336 depend on the types of the devices to be formed.

Silicide regions 138, 238 and 338 are preferably formed to reduce contact resistance. To form silicide regions, a metal layer, preferably comprising nickel or cobalt, is blanket deposited. An annealing is then performed so that the metal layer forms silicide regions with underlying silicon. The un-reacted metal layer is then removed.

Figure 5:
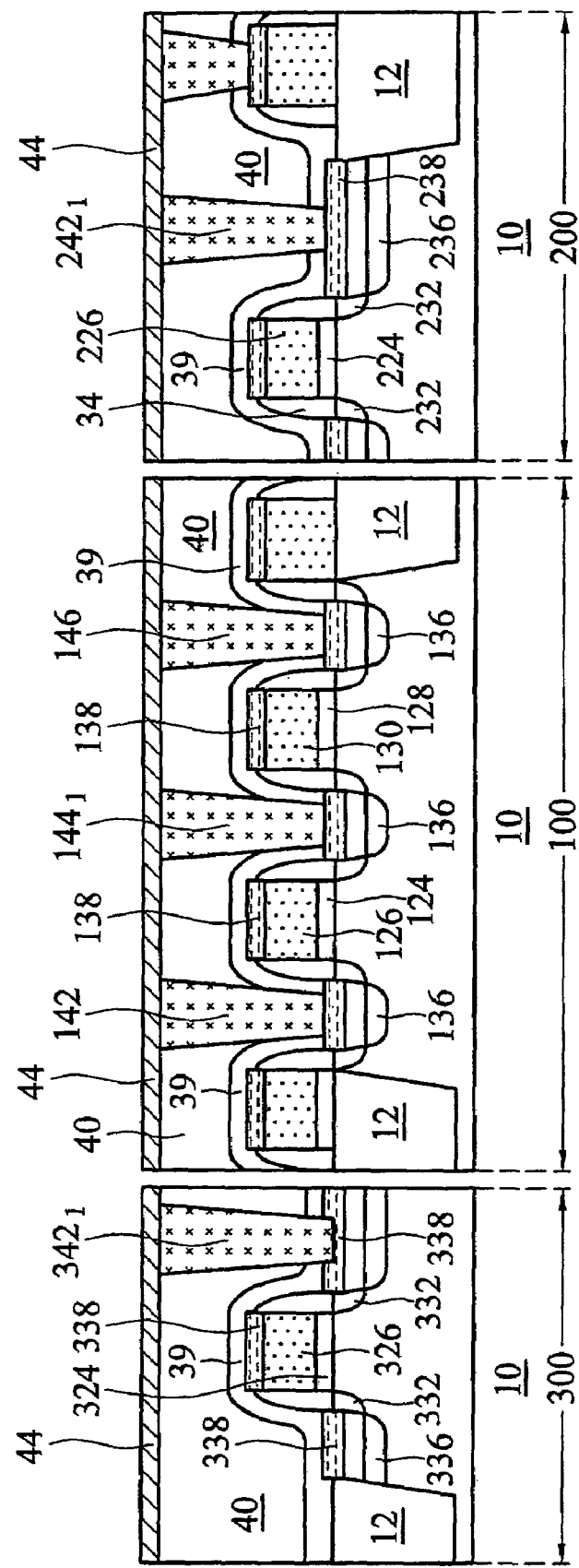

FIG. 5 illustrates the formation of a contact etch stop layer (CESL) 39, a first dielectric layer 40 and contacts 142, $144_1$, 146, $242_1$, and $342_1$. CESL 39 preferably has a k value of between about 3 and about 10, and may comprise nitrogen-containing dielectric materials or carbon-containing dielectric materials, or other materials such as silicon nitride, silicon carbide, silicon oxynitride, and the like. The first dielectric layer 40, sometimes referred to as an inter-layer dielectric (ILD) layer 40, has a first dielectric constant (k value) of less than about 4.2, and more preferably has a first dielectric constant of less than about 3.8, and even more preferably between about 1.2 and about 3.8. In the preferred embodiment, the CESL 39 has a k value substantially greater than the k value of the ILD layer 40. Contact openings are then formed through the ILD layer 40 and CESL 39, connecting to underlying silicide regions. Contact openings may be formed by one-step etching or two-step etching. Conductive materials are filled into the contact openings, forming contacts 142, $144_1$, 146, $242_1$, and $342_1$. Contacts $144_1$, $242_1$ and $342_1$ are lower portions of the subsequently formed contacts 144, 242 and 342, respectively. In the preferred embodiment, contacts 142, $144_1$, 146, $242_1$, and $342_1$ are formed of tungsten or tungsten alloys. Contacts 142, $144_1$, 146, $242_1$ and $342_1$ may also have a composite structure further comprising a diffusion barrier layer, preferably comprising Ti or TiN. In other embodiments, aluminum, copper, or other well known alternatives can be used. Optionally, an etch stop layer 44 is formed over the ILD layer 40.

Figure 6:
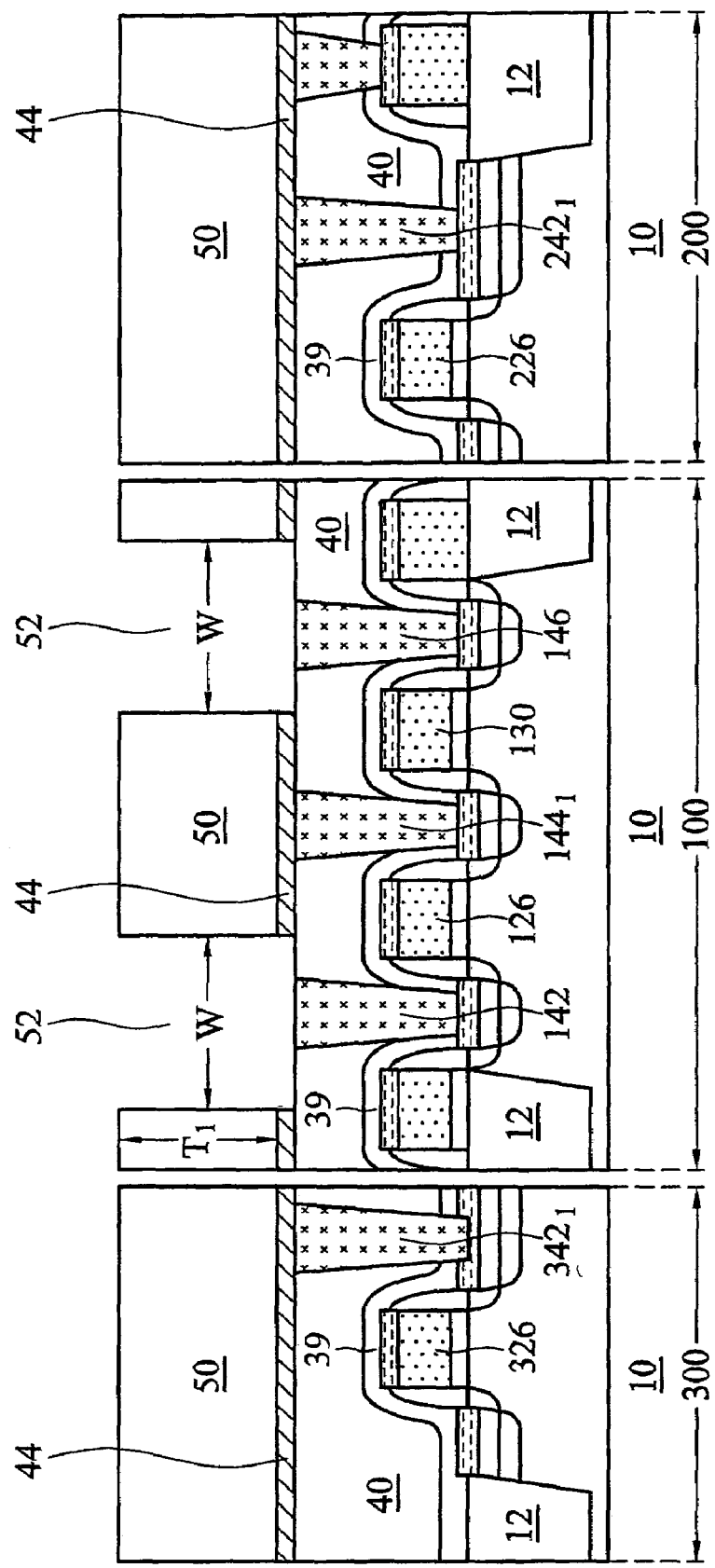

A second dielectric layer 50, also referred to as a crown oxide 50, is formed over the etch stop layer 44, as shown in FIG. 6. Crown oxide 50 is so named as it preferably comprises oxide having a second dielectric constant (k value) of less than about 4.2, such as plasma enhanced chemical vapor deposition (PE-CVD) oxide, or high-density plasma (HDP) oxide, although other low-k dielectric materials can be used. The thickness $T_1$ of the crown oxide 50 is preferably between about 800 Å and about 25,000 Å, and more preferably about 4,500 Å. Openings 52 are then formed, exposing contacts 142 and 146. The formation of openings 52 preferably includes a two-stage process. The first stage includes etching crown oxide 50 and stopping at etch stop layer 44. The second stage includes etching etch stop layer 44. Since etch stop layer 44 is much thinner than the crown oxide 50, etching processes are better controlled. Openings 52 preferably have a width W of between about 2,000 Å and about 80,000 Å, and a width W to height $T_1$ ratio (aspect ratio, or AR) of between about 0.5 and about 20. Crown oxide 50 preferably has a low k value of less than about 3.8. In the preferred embodiment, the k value of the second dielectric layer is substantially less than the first k value of the first dielectric layer (ILD 40). This scheme may increase the mechanical strength of stacked film, decrease delamination defects in the substrate/ILD interface and promote package reliability.

Figure 7:
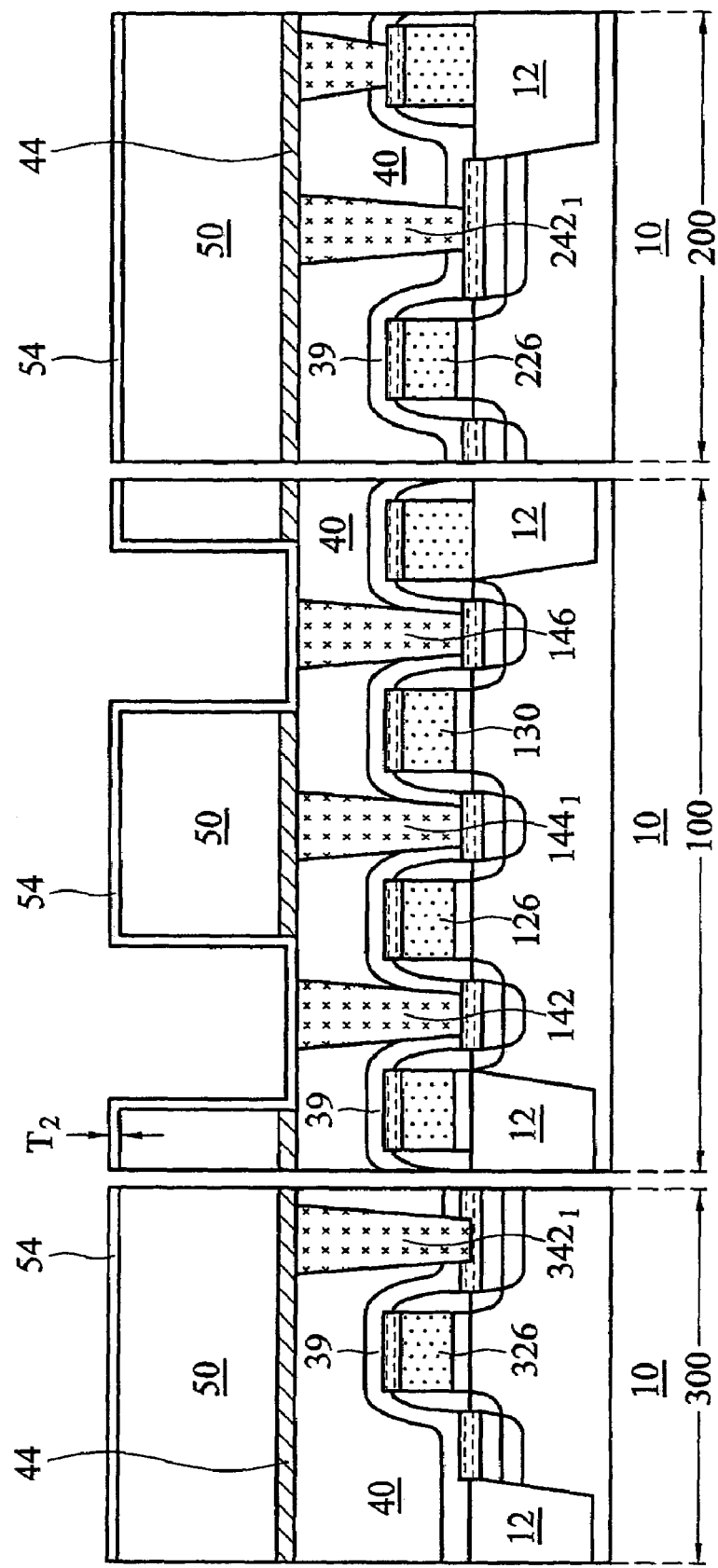

FIG. 7 illustrates the formation of a bottom electrode layer 54. Preferably, the bottom electrode layer 54 comprises conductive materials such as doped polysilicon (and the respective capacitor is referred to as poly-insulator-poly type), Ti, Co, TiN, TiW, W, TiAl, TiAlN, and combinations thereof, and is formed using known methods such as chemical vapor deposition (CVD), sputter deposition, and the like. It may also have a composite structure comprising a diffusion barrier layer and a top conductive layer. The preferred thickness $T_2$ of the bottom electrode layer 54 is between about 50 Å and about 400 Å. When the bottom electrode and subsequently formed top electrode are formed of metal, the respective capacitor is referred to as metal-insulator-metal type.

Figure 8:
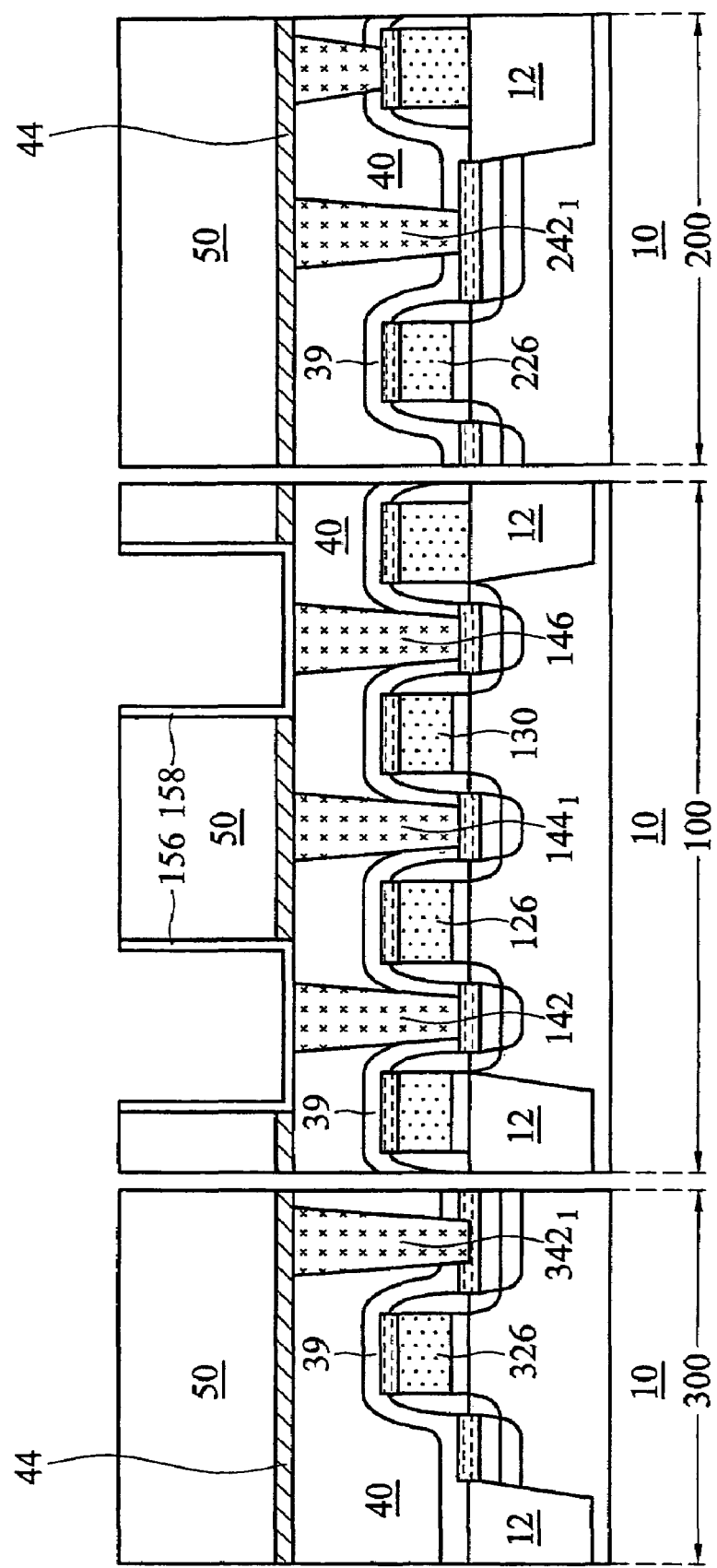

Referring to FIG. 8, a chemical mechanical polish (CMP) is performed to remove portions of the bottom electrode layer 54 on crown oxide 50, leaving bottom electrodes 156 and 158.

Figure 9:
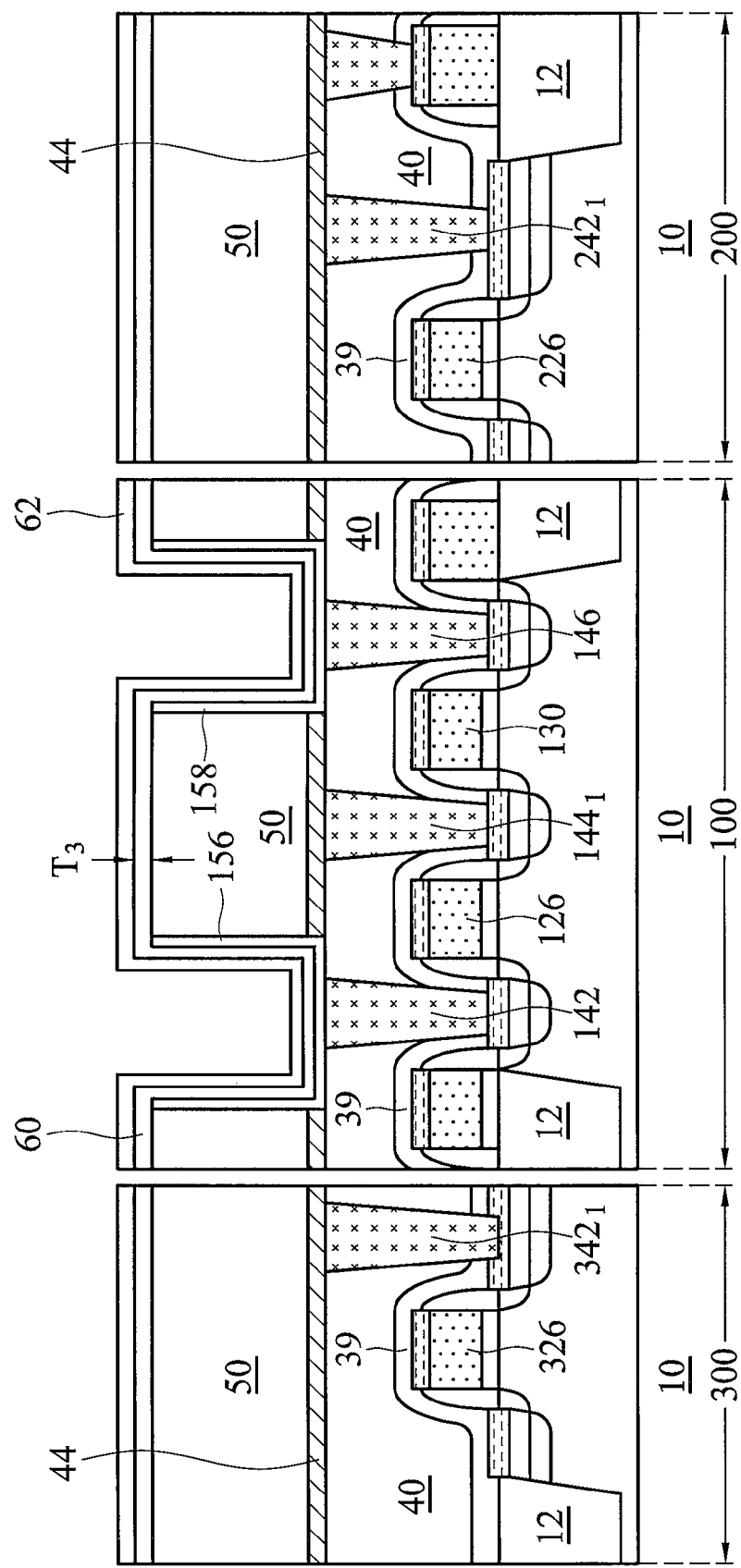

A capacitor dielectric layer 60 and a top electrode layer 62 are then formed, as illustrated in FIG. 9. Capacitor dielectric layer 60 preferably has a high k value of greater than about 3.8, and more preferably greater than about 9, and a thickness $T_3$ of less than about 300 Å, and more preferably between about 20Å and about 300 Å. The top electrode layer 62, which is preferably similar to the bottom electrode layer 54 (refer to FIG. 7), is then formed.

Figure 10:
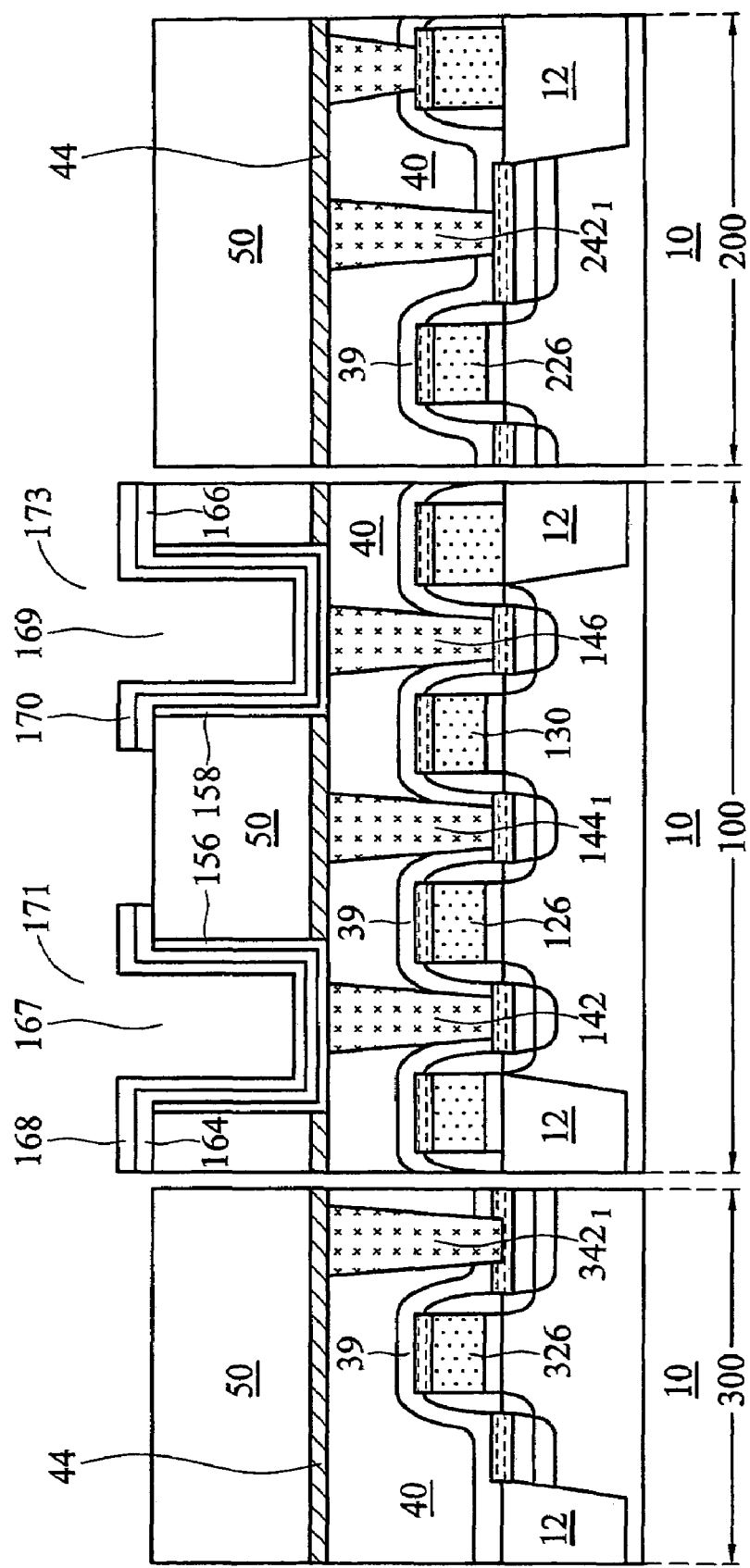

The top electrode layer 62 and capacitor dielectric layer 60 are then patterned, forming a structure shown in FIG. 10. The resulting structure includes two capacitors 171 and 173. Capacitor 171 includes a top electrode 168, an insulator 164 and a bottom electrode 156. Capacitor 173 includes a top electrode 170, an insulator 166 and a bottom electrode 158. In the preferred embodiment, capacitors 171 and 173 are referred to as cup-type capacitors since bottom electrodes 156 and 158 have cup shaped regions 167 and 169, respectively. In other embodiments, capacitors 171 and 173 are formed as cylinder-type capacitors since bottom electrodes 156 and 158 have cylinder-shaped regions 167 and 169, respectively. Although the previously discussed steps only show the formation of two capacitors, in the practical case, one or more memory arrays will be formed in device region 100.

Figure 11:
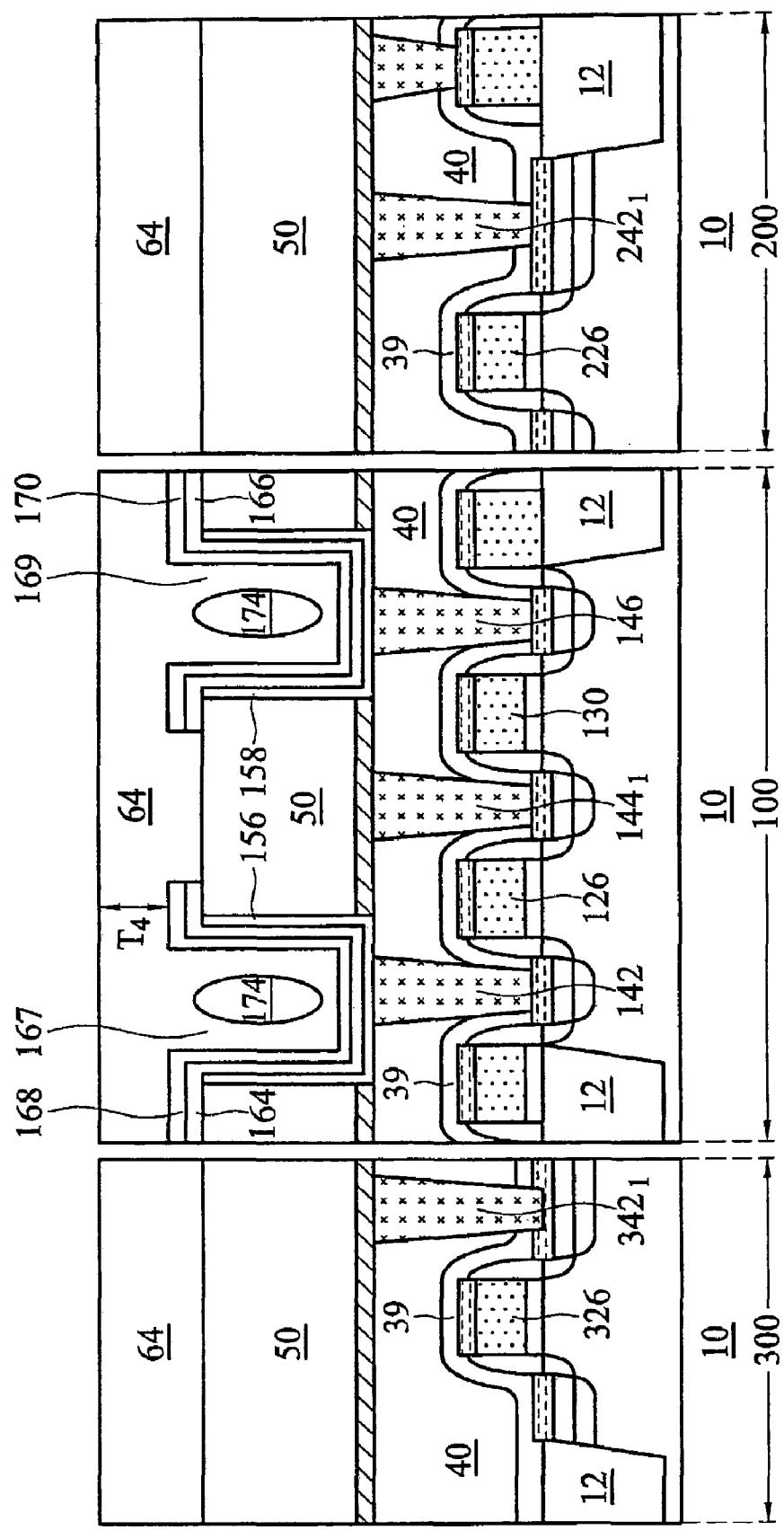

FIG. 11 illustrates the formation of a third dielectric layer 64, which is also referred to as an ILD layer 64. ILD layer 64 preferably has a third dielectric constant (k value) of less than about 4.2, and more preferably between about 2.3 and about 3.8, and even more preferably between about 1.2 and about 2.3. Additionally, the k value of the ILD layer 64 is preferably less than the k value of the ILD layer 40. Preferred materials for forming the ILD layer 64 include PE-CVD dielectric, HDP dielectric, doped dielectric materials comprising carbon and silicon, porous materials, and combinations thereof. Preferred materials for forming the ILD layer 64 having a k value of between about 2.3 and about 3.8 include fluorosilicate glass (FSG), carbon-doped silicate glass, and combinations thereof. Preferred materials for forming the ILD layer 64 having a k value of between about 1.2 and about 2.3 include carbon-doped silicate glass, porous dielectric, and combinations thereof. In the preferred embodiment, the k value of the third dielectric layer is substantially less than the first k value of the first dielectric layer (ILD 40). This scheme may increase the mechanical strength of the stacked film and decrease delamination defects at the interface of substrate/ILD and promote package reliability. Besides filling cup-shaped regions 167 and 169, the ILD layer 64 includes a portion with a thickness $T_4$ over the capacitors 171 and 173, wherein the thickness $T_4$ is preferably between about 500 Å and about 5,000 Å.

Figure 14:
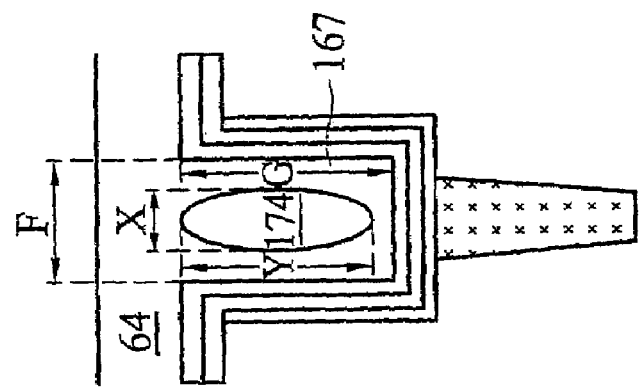
Figure 13:
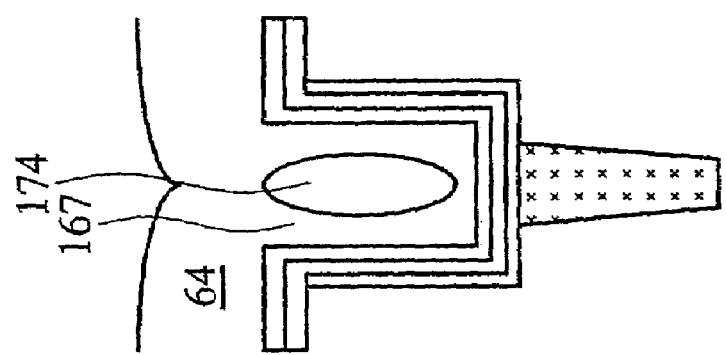
Figure 12:
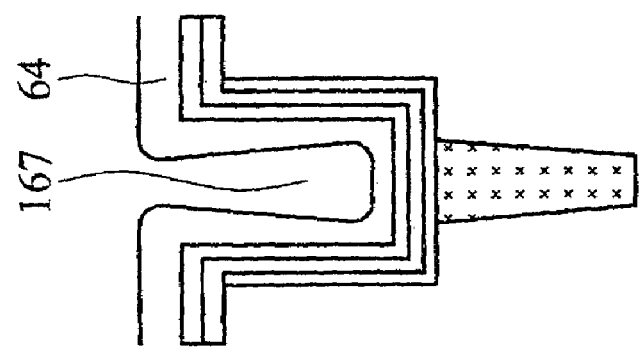

Voids 174 are preferably formed in the cup or inner regions, which may extend slightly out of the cup region, of the capacitors 171 and 173 when ILD layer 64 is deposited. FIGS. 12, 13 and 14 illustrate details for forming voids 174 in cup region 167. In FIG. 12, dielectric materials are deposited. Due to non-conformal step coverage, ILD layer 64 on upper portions of sidewalls of the cup region 167 is thicker than on lower portions. The difference of the thickness between the upper portions and lower portions of the ILD layer 64 can be increased by controlling the formation process.

The deposition rate is an important factor for generating desired high non-conformity and larger voids 174. A preferred deposition rate is between about 8 Å/second and about 30 Å/second.

With continued deposition of the ILD layer 64, upper portions of the ILD layer 64 contact each other and a void 174 is created. The resulting structure is shown in FIG. 13. FIG. 14 illustrates the ILD layer 64 planarized, preferably by a chemical mechanical polish (CMP).

Assuming the cup region 167 has a height G and a width F, and the void 174 has a width X and a height Y, then the ratio of the width X of the void 174 to width F of the cup region 167 is preferably greater than about 10 percent, and more preferably between about 10 and about 90 percent. The ratio of the height Y of the void 174 to height G of the cup region 167 is preferably greater than about 10 percent, and more preferably between about 10 and about 90 percent. Void 174 in cup region 167 preferably has similar specifications.

Figure 15:
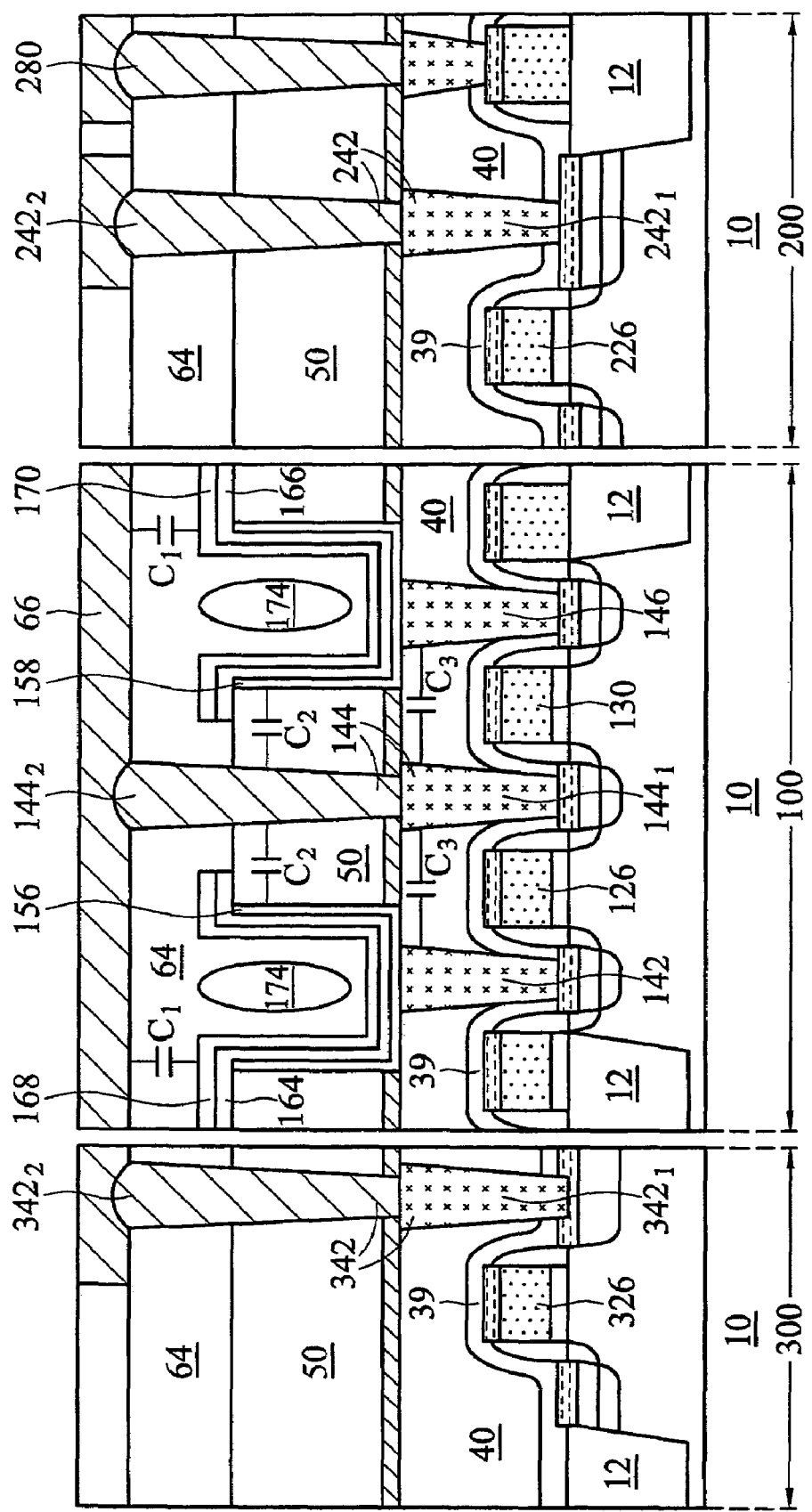

FIG. 15 illustrates the formation of contacts $144_2$, $242_2$ and $342_2$ and bitline 66 in metallization layer one. The bitline 66 is a conductor line preferably comprising copper or copper alloys. Contacts $144_1$, $242_1$ and $342_1$ and respective contacts $144_2$, $242_2$ and $342_2$ form stacked contacts 144, 242 and 342, respectively. In the preferred embodiment, contacts $144_2$, $242_2$ and $342_2$ are contact plugs (preferably tungsten plugs) and are formed using similar methods as used for forming the bottom portions $144_1$, $242_1$, and $342_1$. Oxide buffing may result in top portion of stacked contacts 144, 242 and 342 being higher than the surface of the third dielectric layer 64. Bitline 66 is then formed using a single damascene process. Preferably, contacts $144_2$, $242_2$ and $342_2$ have rounded top portions extending into bitline 66 so that the respective contact areas with bitline 66 are increased, resulting in decreased resistance and increased reliability. In other embodiments, contacts $144_2$, $242_2$ and $342_2$ and bitline 66 are formed using dual damascene processes, wherein the upper portions $144_2$, $242_2$ and $342_2$ of the stacked contacts 144, 242 and 342 comprise copper. The details of the dual damascene processes are known in the art, thus are not repeated herein.

The previously discussed embodiment illustrates how two capacitors are formed. By using the discussed methods and materials, capacitor arrays, which comprise capacitors arranged in rows and columns and connected using buses similar to the bitline 66, can be formed.

Figure 16:
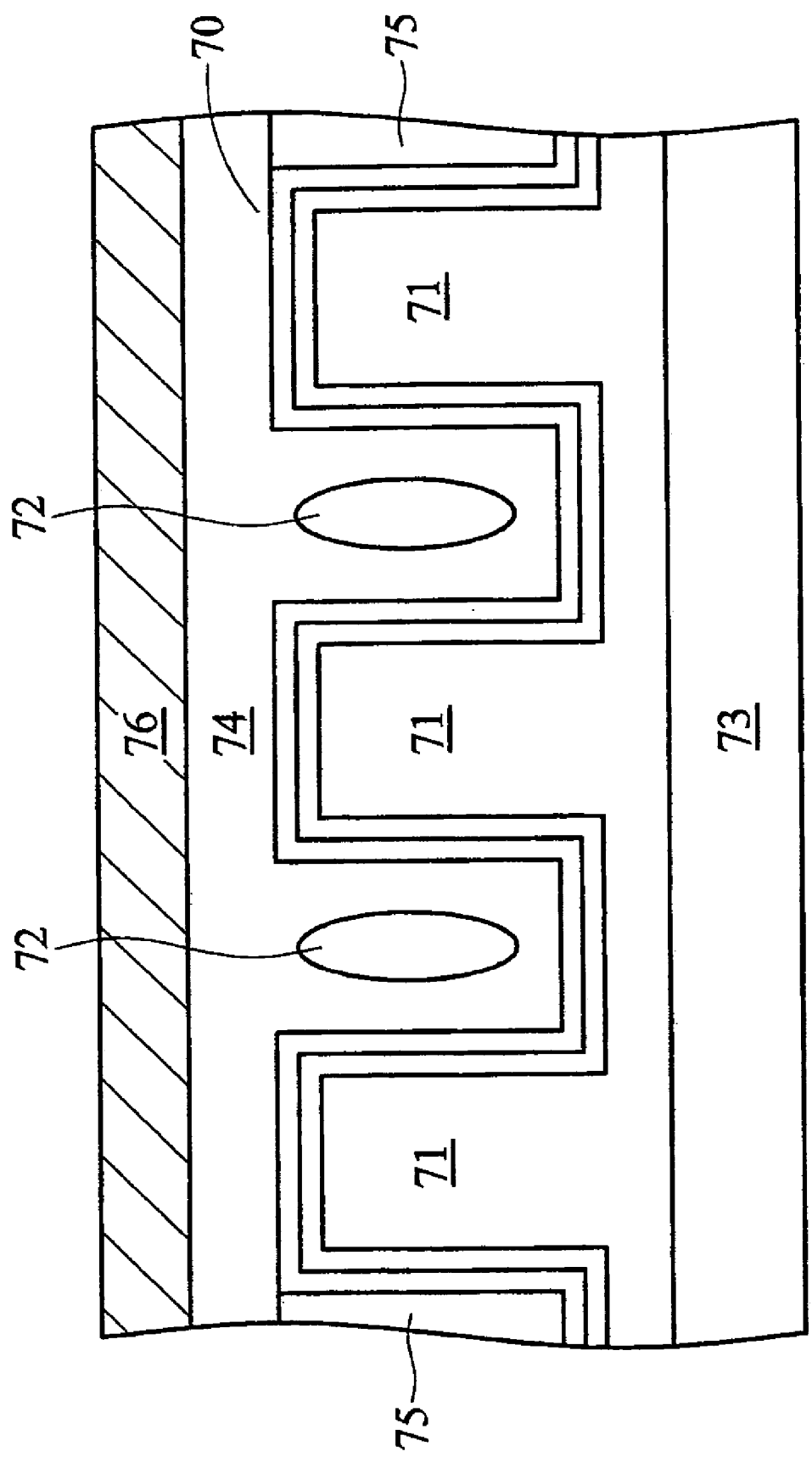
FIG. 16 illustrates a cross-sectional view of a cylinder-type capacitor.

A variation of the preferred embodiment of the present invention is shown in FIG. 16, wherein only one capacitor 70 is shown. The capacitor 70 is referred to as a cylinder-type capacitor since it has cylinder-like bottom electrodes 71, although the cross-sectional view of the bottom electrodes 71 may actually look like a rectangle instead of a circle, as shown in FIG. 16. Similar to the cup-type capacitors, the capacitor 70 is preferably surrounded by ILD layers 73, 74 and a crown oxide 75, which have similar requirements as the respective ILD layers 40, 64 and crown oxide 50 (refer to FIG. 15). Preferably, voids 72 with greater dimensions are formed in the cup regions of the capacitor 70.

The preferred embodiments of the present invention have low parasitic capacitances. Table 1 shows simulation results of the preferred embodiments of the present invention, wherein the results have been compared to that of a prior art embodiment, which is based on a 90 nm technology node.

TABLE 1

| Items | Prior art | Low k (k = 2.3~3.8) | Ultra low k (k = 1.2~2.3) |
|---|---|---|---|
| $C_{bl}$ | 1 | 0.96 | 0.90 |
| $C_1$ | 1 | 0.89 | 0.75 |
| $C_2$ | 1 | 0.85 | 0.73 |
| $C_3$ | 1 | 0.92 | 0.84 |

In Table 1, the prior art parasitic capacitances are used as bases and are represented by a relative value 1. Parasitic capacitances obtained from the preferred embodiments of the present invention are normalized to the respective prior art capacitance values, and are represented using relative capacitance values. Due to low-k values of the dielectrics 40, 50 and 64 used in the preferred embodiments, bitline capacitor $C_{bl}$, parasitic capacitances $C_1$, which are between top electrodes 168, 170 and bitline 66 (refer to FIG. 15), parasitic capacitances $C_2$, which are between electrodes 156 and 158 and contact 144, and parasitic capacitances $C_3$, which are between contacts 142 and 144 are reduced compared to the prior art. Significant capacitance reduction has been observed from simulation results when dielectrics 40, 50 and 64 have k values of lower than about 3.8. For example, capacitances $C_1$, $C_2$ and $C_3$ are only about 0.89, 0.85 and 0.92 of the respective prior art capacitances. If k values of the dielectrics 40, 50 and 64 are further reduced into ultra low-k range, respective capacitances are further reduced accordingly.

Additionally, in the core region 200, due to the low k value of crown oxide 50, parasitic capacitance between neighboring upper portions of the metal lines $242_2$ and 280 is reduced. This increases the performance of core devices, for example, memory controlling circuits. As a result, overall performance of the memory chip is improved. In addition, the bitline capacitance $C_{bl}$ is reduced accordingly.

Figure 17:
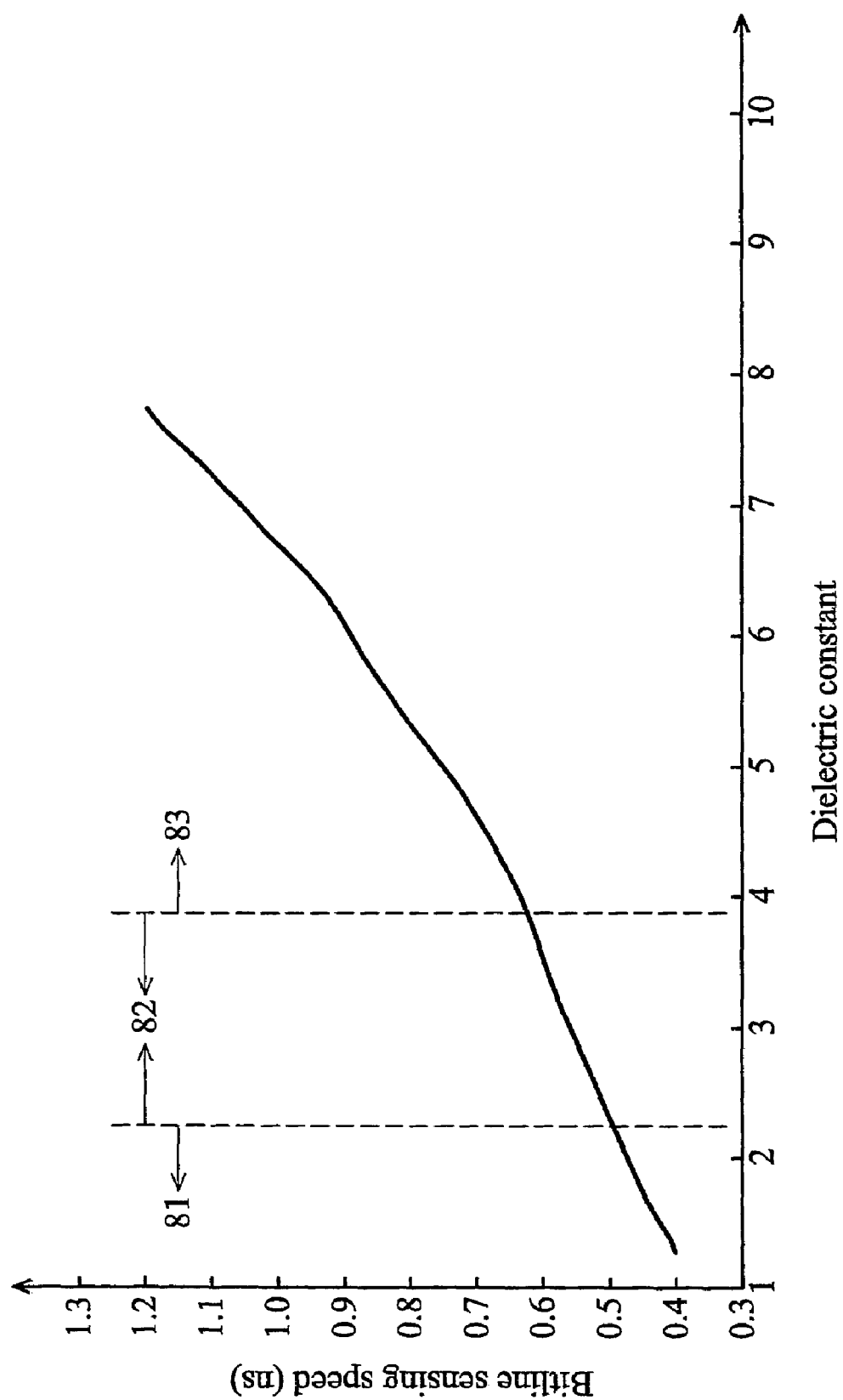
FIG. 17 illustrates requirements for bitline sensing speed for various applications.

The reduction of the k values increases the sensing speed of the preferred embodiments of the present invention due to the reduction of parasitic capacitances. FIG. 17 illustrates typical requirements for bitline sensing speed for various applications. In current industrial applications (range 83), bitline sensing speeds are typically greater than about 0.62 ns. High performance logic/ASIC applications (range 82) typically require bitline sensing speeds of about 0.5 to about 0.62 ns. High-speed silicon on chip (SOC) and/or embedded memory applications (range 81) typically require bitline sensing speeds of less than about 0.5. It is expected the bitline sensing speeds of the preferred embodiments of the present invention are in region 81.

By using the preferred embodiments of the present invention, the reliability of DRAM devices is improved. As is shown in Equation 1, when the bitline parasitic capacitance $C_{bl}$ decreases, the sensing signal $\Delta V$ increases, which increases the sensing margin, resulting in less sensing error. Also, smaller parasitic capacitance leads to faster charging and discharging, hence higher performance for accessing memory cells.

The preferred embodiments of the present invention have several advantageous features in addition to the reduced parasitic capacitances, increased sensing speed and increased sensing margin. Firstly, the preferred embodiments of the present invention are fully compatible with the existing capacitor fabrication processes, and there is no extra cost involved. Secondly, the process flow is simplified. Thirdly, the yield is increased.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A memory device comprising:
a semiconductor substrate;
a dielectric layer having a first k value over the semiconductor substrate;
a capacitor in the first dielectric layer comprising an inner region and a void in the inner region;
an additional dielectric layer having a second k value over the capacitor, wherein the additional dielectric layer is a low-k dielectric layer, wherein the inner region is partially filled by the additional dielectric layer, and wherein the void is free from, and is enclosed by, the additional dielectric layer, and;
a conductive line over the additional dielectric layer and electrically coupled to a top electrode of the capacitor.

2. The memory device of claim 1, wherein the second k value is between about 2.3 and about 3.8.

3. The memory device of claim 2, wherein the additional dielectric layer comprises fluorosilicate glass (FSG).

4. The memory device of claim 1, wherein the void is within the inner region formed by the capacitor.

5. The memory device of claim 4, wherein the void has a width of greater than about 10 percent of a width of the inner region and a height of greater than about 10 percent of a height of the inner region.

6. The memory device of claim 1, wherein the second k value is between about 1.2 and about 2.3.

7. The memory device of claim 1, wherein the capacitor is of a cup-type.

8. The memory device of claim 1, wherein the capacitor is of a cylinder-type.

9. The memory device of claim 1, wherein the capacitor is of a metal-insulator-metal type.

10. The memory device of claim 1 further comprising an intermediate dielectric layer underlying the first dielectric layer and over the semiconductor substrate.

11. The memory device of claim 10, wherein the intermediate dielectric layer has a k value substantially greater than the first k value.

12. A memory device comprising:
a semiconductor substrate;
a first dielectric layer over the semiconductor substrate;
a second dielectric layer over the first dielectric layer;
a third dielectric layer over the second dielectric layer, wherein the third dielectric layer has a lower k value than the second dielectric layer;
a plurality of stacked contacts comprising upper portions and lower portions, wherein portions of the upper portions of the stacked contacts are in the third dielectric layer, and wherein lower portions of the stacked contacts are substantially in the first dielectric layer, wherein top surfaces of the upper portions of the stacked contacts are higher than a top surface of the third dielectric layer;
a capacitor formed in the second dielectric, wherein an inner region formed between vertical plates of the capacitor has a void enclosed by materials of the third dielectric layer, and wherein the void is free from the materials of the third dielectric layer; and;
a conductive line over the third dielectric layer and electrically coupled to a top electrode of the capacitor.

13. The memory device of claim 12, wherein the third dielectric layer has a k value of between about 1.2 and about 3.8.

14. The memory device of claim 12, wherein the upper portions and lower portions of the stacked contacts comprise tungsten.

15. The memory device of claim 12, wherein the lower portions of the stacked contacts comprise tungsten, and wherein the upper portions of the stacked contacts comprise copper.

16. A memory device comprising:
an active region in a semiconductor substrate
a contact on the active region; a dielectric layer having a first k value over
the semiconductor substrate; a capacitor in the dielectric layer and on the contact;
an additional dielectric layer having a second k value over the capacitor, wherein the second k value is different from the first k value, wherein an inner region formed between vertical plates of the capacitor has a void enclosed by materials of the additional dielectric layer, and wherein the void is free from the materials of the additional dielectric layer; and;
a conductive line over the additional dielectric layer and electrically coupled to a top electrode of the capacitor.

17. The memory device of claim 16, wherein the second k value is lower than the first k value.

* * * * *